US012294339B2

(12) United States Patent
Shimamoto

(10) Patent No.: US 12,294,339 B2
(45) Date of Patent: May 6, 2025

(54) POWER AMPLIFIER CIRCUIT

(71) Applicant: Murata Manufacturing Co., Ltd., Kyoto (JP)

(72) Inventor: Kenichi Shimamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 563 days.

(21) Appl. No.: 17/650,408

(22) Filed: Feb. 9, 2022

(65) Prior Publication Data

US 2022/0271720 A1 Aug. 25, 2022

(30) Foreign Application Priority Data

Feb. 10, 2021 (JP) ................................. 2021-019617
May 31, 2021 (JP) ................................. 2021-091645

(51) Int. Cl.
*H03F 3/24* (2006.01)
*H03F 1/02* (2006.01)
*H03F 3/195* (2006.01)

(52) U.S. Cl.
CPC ........... *H03F 3/245* (2013.01); *H03F 1/0222* (2013.01); *H03F 3/195* (2013.01); *H03F 2200/451* (2013.01)

(58) Field of Classification Search
CPC ........ H03F 3/245; H03F 1/0222; H03F 3/195; H03F 2200/451; H03F 2200/18; H03F 2200/318; H03F 1/0261; H03F 3/211; H03F 3/20; H03F 1/30; H03F 1/302; H03F 2203/21127; H03F 2203/21131
USPC .............................. 330/295, 124 R, 286, 310
See application file for complete search history.

(56) References Cited

U.S. PATENT DOCUMENTS

| | | | | |
|---|---|---|---|---|
| 7,795,968 B1* | 9/2010 | Li | ............................ | H03F 3/72 330/129 |
| 8,508,299 B2* | 8/2013 | Kawano | .................... | H03F 3/72 330/51 |
| 8,836,431 B2* | 9/2014 | Han | ........................ | H03F 3/211 330/51 |
| 8,928,402 B2* | 1/2015 | Gajadharsing | ........ | H03F 1/0294 330/124 R |
| 10,218,313 B2* | 2/2019 | Moronval | ............... | H01L 23/66 |
| 2017/0163223 A1 | 6/2017 | Shimamoto | | |

FOREIGN PATENT DOCUMENTS

JP 2017-103643 A 6/2017

* cited by examiner

*Primary Examiner* — Hieu P Nguyen
(74) *Attorney, Agent, or Firm* — MCDONALD HOPKINS LLC

(57) ABSTRACT

A power amplifier circuit 10 includes amplifiers 102 and 103, bias circuits 1023 and 1033, and a control circuit 106 that controls the bias circuits 1023 and 1033. When the power amplifier circuit 10 operates in a low power mode, the control circuit 106 controls the bias circuit 1023 and the bias circuit 1033 such that a bias current or voltage is supplied to the amplifier 102 and a bias current or voltage is not supplied to the amplifier 103. When the power amplifier circuit 10 operates in a high power mode in which an output power is higher than an output power in the low power mode, the control circuit 106 controls the bias circuit 1023 and the bias circuit 1033 such that a bias current or voltage is supplied to the amplifier 102 and a bias current or voltage is supplied to the amplifier 103.

11 Claims, 10 Drawing Sheets

POWER AMPLIFIER CIRCUIT

CROSS REFERENCE TO RELATED APPLICATIONS

This application claims priority from Japanese Patent Application No. 2021-019617 filed Feb. 10, 2021 and claims priority from Japanese Patent Application No. 2021-091645 filed on May 31, 2021. The contents of these applications are incorporated herein by reference in their entireties.

BACKGROUND OF THE DISCLOSURE

Field of the Disclosure

The present disclosure relates to a power amplifier circuit.

Description of the Related Art

In mobile communication using mobile phones and the like, power amplifier circuits are used to amplify power of transmission signals. Power amplifier circuits switch the power level of a transmission signal to thereby transmit the transmission signal at an appropriate power level. Japanese Unexamined Patent Application Publication No. 2017-103643 describes a power amplifier circuit that is capable of switching the power level and reduces current consumption while suppressing degradation of gain characteristics.

In the power amplifier circuit described in Japanese Unexamined Patent Application Publication No. 2017-103643, a control circuit controls a bias circuit so as to maintain a necessary amount of bias current, thereby suppressing degradation of gain characteristics when the power level is high and so as to avoid unnecessary current consumption while suppressing an effect on gain characteristics when the power level is low.

When the power amplifier circuit performs power amplification while switching between a high power mode in which amplification is performed at a high power level and a low power mode in which amplification is performed at a low power level, the gain of the power amplifier circuit may decrease upon switching between the high power mode and the low power mode. Specifically, upon switching from the high power mode to the low power mode, the gain of the power amplifier circuit may temporarily become lower than a predetermined gain in the low power mode. The decrease in the gain upon switching may cause, for example, degradation of a transmission signal. As a result, the transmission signal might not be appropriately amplified.

The present disclosure has been made in view of the above-described circumstances, and an object thereof is to provide a power amplifier circuit that is capable of suppressing a gain decrease upon switching of the operation state of the power amplifier circuit.

BRIEF SUMMARY OF THE DISCLOSURE

A power amplifier circuit according to an aspect of the present disclosure includes: a first amplifier that has a first input port and amplifies a first signal inputted via the first input port; a second amplifier that has a second input port connected in parallel with the first input port of the first amplifier and amplifies a second signal inputted via the second input port; a first bias circuit that supplies a first bias current or voltage to the first amplifier; a second bias circuit that supplies a second bias current or voltage to the second amplifier; and a control circuit that controls the first bias circuit and the second bias circuit. When the power amplifier circuit operates in a first power mode, the control circuit controls the first bias circuit and the second bias circuit such that the first bias current or voltage is supplied to the first amplifier and the second bias current or voltage is not supplied to the second amplifier, and when the power amplifier circuit operates in a second power mode in which an output power is higher than an output power in the first power mode, the control circuit controls the first bias circuit and the second bias circuit such that the first bias current or voltage is supplied to the first amplifier and the second bias current or voltage is supplied to the second amplifier.

According to the present disclosure, it is possible to provide a power amplifier circuit that is capable of suppressing a gain decrease upon switching of the operation state of the power amplifier circuit.

DETAILED DESCRIPTION OF THE DISCLOSURE

Figure 1:
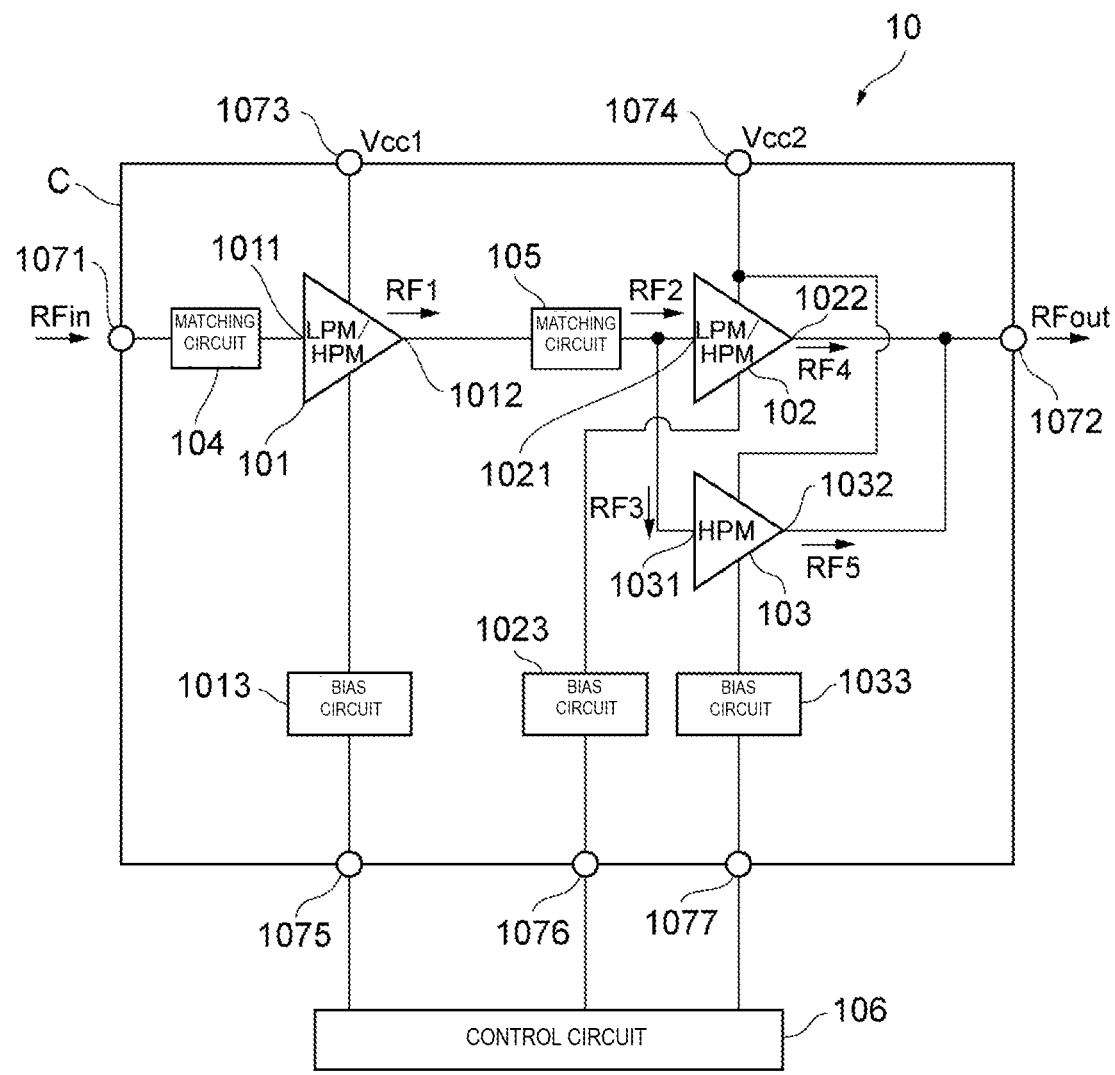
FIG. 1 is a block diagram of a power amplifier circuit according to a first embodiment.

A description of a first embodiment will be given. FIG. 1 is a block diagram of a power amplifier circuit 10 according to the first embodiment. The power amplifier circuit 10 includes amplifiers 101, 102, and 103, bias circuits 1013, 1023, and 1033, matching circuits 104 and 105, and a control circuit 106. The power amplifier circuit 10 further includes terminals 1071, 1072, 1073, 1074, 1075, 1076, and 1077. The amplifiers 101, 102, and 103, the bias circuits 1013, 1023, and 1033, and the matching circuits 104 and 105 are disposed on a semiconductor chip C.

Power amplification in the power amplifier circuit 10 is performed in a low power mode (LPM) (first power mode) in which the amplifier 102 performs power amplification or in a high power mode (HPM) (second power mode) in which both the amplifier 102 and the amplifier 103 perform power amplification, in accordance with bias currents or voltages supplied to the amplifier 102 and the amplifier 103. The high power mode is an operation state in which the power of an output signal RFout of the power amplifier circuit 10 is higher than the power of the output signal RFout in the low power mode.

The amplifier (third amplifier) 101 has an input port 1011 and an output port 1012. The input port 1011 is connected to the terminal 1071 with the matching circuit 104 interposed therebetween. The output port 1012 is connected to the amplifier 102 and the amplifier 103 with the matching circuit 105 interposed therebetween. To the amplifier 101, a power voltage Vcc1 is supplied via the terminal 1073.

The amplifier 101 amplifies an input signal (third signal) RFin inputted via the terminal 1071 and outputs a signal RF1.

The amplifier (first amplifier) 102 has an input port (first input port) 1021 and an output port 1022. The input port 1021 is connected to the output port 1012 with the matching circuit 105 interposed therebetween. The output port 1022 is connected to the outside of the power amplifier circuit 10 with the terminal 1072 interposed therebetween. To the amplifier 102, a power voltage Vcc2 is supplied via the terminal 1074.

The amplifier (second amplifier) 103 has an input port (second input port) 1031 and an output port 1032. The input port 1031 is connected to the output port 1012 with the matching circuit 105 interposed therebetween. The input port 1031 is connected in parallel with the input port 1021. To the amplifier 103, the power voltage Vcc2 is supplied via the terminal 1074.

The bias circuit 1013 supplies a bias current or voltage to the amplifier 101 in accordance with a signal supplied via the terminal 1075. The bias circuit 1023 (first bias circuit) supplies a bias current or voltage (first bias current or voltage) to the amplifier 102 in accordance with a signal supplied via the terminal 1076. The bias circuit (second bias circuit) 1033 provides a bias current or voltage (second bias current or voltage) to the amplifier 103 in accordance with a signal supplied via the terminal 1077.

When the power amplifier circuit 10 performs power amplification in the low power mode, the amplifier 102 amplifies a signal (first signal) RF2 inputted via the input port 1021 and outputs a signal RF4. When the power amplifier circuit 10 performs power amplification in the low power mode, the amplifier 103 does not perform power amplification. In other words, a signal indicating that the power is zero is outputted from the amplifier 103. The signal RF2 corresponds to the signal RF1 entirely.

In the low power mode, the power amplifier circuit 10 outputs the signal RF4 from the amplifier 102 as the output signal RFout.

When the power amplifier circuit 10 performs power amplification in the high power mode, the amplifier 102 amplifies the signal RF2 that is a portion of the signal RF1 outputted from the amplifier 101 and that is inputted via the input port 1021, and outputs the signal RF4. When the power amplifier circuit 10 performs power amplification in the high power mode, the amplifier 103 amplifies a signal (second signal) RF3 that is another portion of the signal RF1 outputted from the amplifier 101 and that is inputted via the input port 1031, and outputs a signal RF5.

In the high power mode, the power amplifier circuit 10 outputs the output signal RFout that is a signal obtained by combining the signal RF4 and the signal RF5.

The matching circuit 104 is a circuit for impedance matching between the terminal 1071 and the input port 1011. The matching circuit 105 is a circuit for impedance matching between the output port 1012 and the input ports 1021 and 1031.

The control circuit 106 is a circuit for performing control to switch the power mode of the power amplifier circuit 10. The control circuit 106 is connected to the bias circuits 1013, 1023, and 1033 with the terminals 1075, 1076, and 1077 interposed therebetween, respectively.

The control circuit 106 outputs to the bias circuit 1013 a control signal for causing the bias circuit 1013 to supply a bias current or voltage to the amplifier 101 regardless of whether the state of the power amplifier circuit 10 is the low power mode or the high power mode. The control signal may be, for example, a signal for setting the current or the voltage to a predetermined current value or a predetermined voltage value. The control signal may be a signal for setting the current value or the voltage value to zero.

When the power amplifier circuit operates in the low power mode, the control circuit 106 outputs control signals to the bias circuit 1023 and the bias circuit 1033 such that a bias current or voltage is supplied to the amplifier 102 and a bias current or voltage is not supplied to the amplifier 103.

When the power amplifier circuit operates in the high power mode, the control circuit 106 outputs control signals to the bias circuit 1023 and the bias circuit 1033 such that bias currents or voltages are supplied to the amplifier 102 and the amplifier 103.

That is, the amplifier 102 performs power amplification regardless of whether the operation state is the low power mode or the high power mode. The amplifier 103 performs power amplification only when the operation state is the high power mode. Accordingly, even when the operation state of the power amplifier circuit 10 switches from the high power mode to the low power mode, the amplifier 102 can be continuously operated.

Figure 2:
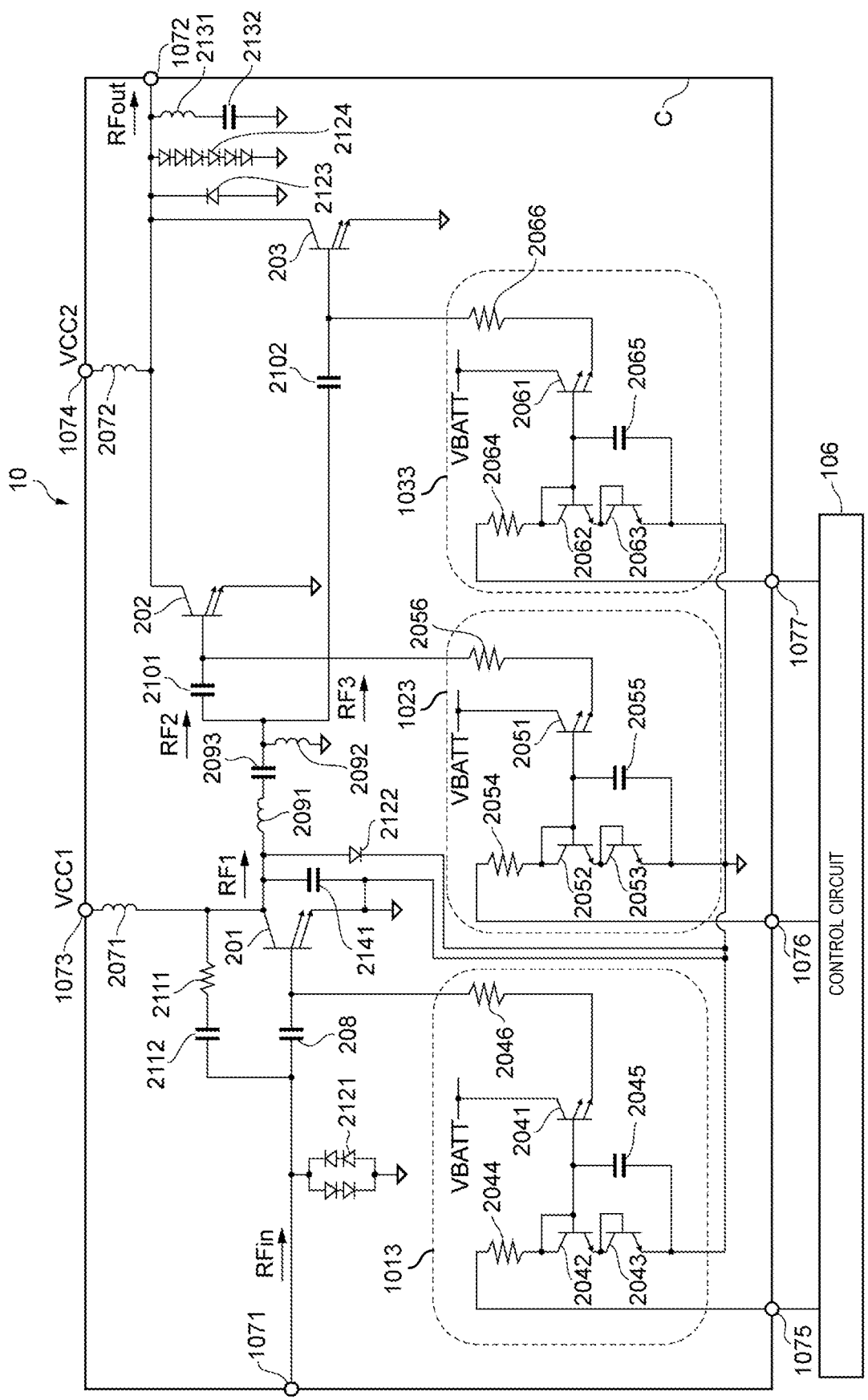
FIG. 2 is a circuit diagram of the power amplifier circuit according to the first embodiment.

With reference to FIG. 2, the circuits in the power amplifier circuit 10 will be described in detail. The power amplifier circuit 10 includes a transistor 201 as the amplifier 101, a transistor 202 as the amplifier 102, and a transistor 203 as the amplifier 103. Note that each of the amplifiers 101, 102, and 103 may be formed of one transistor as illustrated in FIG. 2 or may be formed of a plurality of transistors.

The base of the transistor 201 is connected to the terminal 1071 with a capacitor 208 interposed therebetween, the collector thereof is connected to the terminal 1073 with an inductor 2071 interposed therebetween, and the emitter thereof is grounded.

The base of the transistor 202 is connected to the collector of the transistor 201 with a capacitor 2101 interposed therebetween, the collector thereof is connected to the terminal 1074 with an inductor 2072 interposed therebetween, and the emitter thereof is grounded.

The base of the transistor 203 is connected to the collector of the transistor 201 with a capacitor 2102 interposed therebetween, the collector thereof is connected to the terminal 1074 with the inductor 2072 interposed therebetween, and the emitter thereof is grounded.

Each of the transistors 201, 202, and 203 is, for example, a heterojunction bipolar transistor (HBT).

Each of the transistors 201, 202, and 203 is a multi-finger transistor including a plurality of unit transistors. The number of fingers of the transistor 202 that operates in the low power mode and the high power mode can be made larger than the number of fingers of the transistor 203 that operates only in the high power mode. For example, the number of fingers of the transistor 202 can be 14, and the number of fingers of the transistor 203 can be 6.

The bias circuit 1013 includes transistors 2041, 2042, and 2043, a resistance element 2044, a capacitor 2045, and a resistance element 2046.

The base of the transistor 2041 is connected to the resistance element 2044, the collector thereof is connected to a power source, and the emitter thereof is connected to the resistance element 2046. The base of the transistor 2041 is grounded with the capacitor 2045 interposed therebetween. To the collector of the transistor 2041, a voltage VBATT is supplied.

The base and the collector of the transistor 2042 are diode-connected with each other, the collector thereof is connected to the resistance element 2044, and the emitter thereof is connected to the collector of the transistor 2043. The base and the collector of the transistor 2043 are diode-connected with each other, and the emitter thereof is grounded.

The resistance elements 2044 and 2046 are disposed in order to cause a predetermined voltage drop by the currents flowing therethrough. The capacitor 2045 functions so as to cause the AC component of the current that is supplied to the base of the transistor 2041 to flow into the ground.

When a control signal (for example, a control current) is supplied to the resistance element 2044 from the control circuit 106, the bias circuit 1013 supplies a bias current or voltage to the base of the transistor 201 from the emitter of the transistor 2041 in accordance with the control current.

The bias circuit 1023 includes transistors 2051, 2052, and 2053, a resistance element 2054, a capacitor 2055, and a resistance element 2056. The bias circuit 1033 includes transistors 2061, 2062, and 2063, a resistance element 2064, a capacitor 2065, and a resistance element 2066.

Connections of the elements in each of the bias circuits 1023 and 1033 are similar to connections of the elements in the bias circuit 1013, and the elements in each of the bias circuits 1023 and 1033 have functions similar to the functions of the elements in the bias circuit 1013.

When a control current is supplied to the resistance element 2054 from the control circuit 106, the bias circuit 1023 supplies a bias current or voltage to the base of the transistor 202 from the emitter of the transistor 2051 in accordance with the control current.

When a control current is supplied to the resistance element 2064 from the control circuit 106, the bias circuit 1033 supplies a bias current or voltage to the base of the transistor 203 from the emitter of the transistor 2061 in accordance with the control current.

In the low power mode, the control circuit 106 supplies a control current to the resistance element 2054 and does not supply a control current to the resistance element 2064. Accordingly, in the low power mode, the signal RF2 is amplified only by the transistor 202.

In the high power mode, the control circuit 106 supplies a control current to the resistance element 2054 and further supplies a control current to the resistance element 2064. Accordingly, in the high power mode, the signals RF2 and RF3 are amplified by the transistors 202 and 203 respectively.

Between the transistor 201 and the transistors 202 and 203, inductors 2091 and 2092 and a capacitor 2093 are disposed. The inductors 2091 and 2092 and the capacitor 2093 have a function of matching the output impedance of the transistor 201 with the input impedances of the transistors 202 and 203.

In the power amplifier circuit 10, a resistance element 2111 and a capacitor 2112 are disposed in series so as to connect the collector and the base of the transistor 201 with each other. The resistance element 2111 and the capacitor 2112 are disposed in order to stabilize amplification by the transistor 201.

Protection circuits 2121, 2122, 2123, and 2124 are disposed between an amplification path from the terminal 1071 to the terminal 1072 and the ground. Each of the protection circuits 2121, 2122, 2123, and 2124 includes, for example, one or more circuit elements, such as diodes. Note that the number of stages of diodes included in each of the protection circuits 2121, 2122, 2123, and 2124 is adjusted as appropriate in accordance with a desired voltage.

An inductor 2131 and a capacitor 2132 are disposed in series between the ground and the collectors of the transistors 202 and 203. The inductor 2131 and the capacitor 2132 have a function of adjusting the impedance of the terminal 1072 seen from the collectors of the transistors 202 and 203.

In the power amplifier circuit 10, the bias circuits 1023 and 1033 are respectively connected to the transistors 202 and 203. Therefore, for example, in the low power mode in which the transistor 203 is turned off, a signal from the bias circuit 1023 does not come to the transistor 203. Accordingly, operations of the power amplifier circuit 10 can be stabilized.

Operations of the power amplifier circuit 10 will be described with reference to example references illustrated in FIG. 3 and FIG. 7 to FIG. 10.

Figure 3:
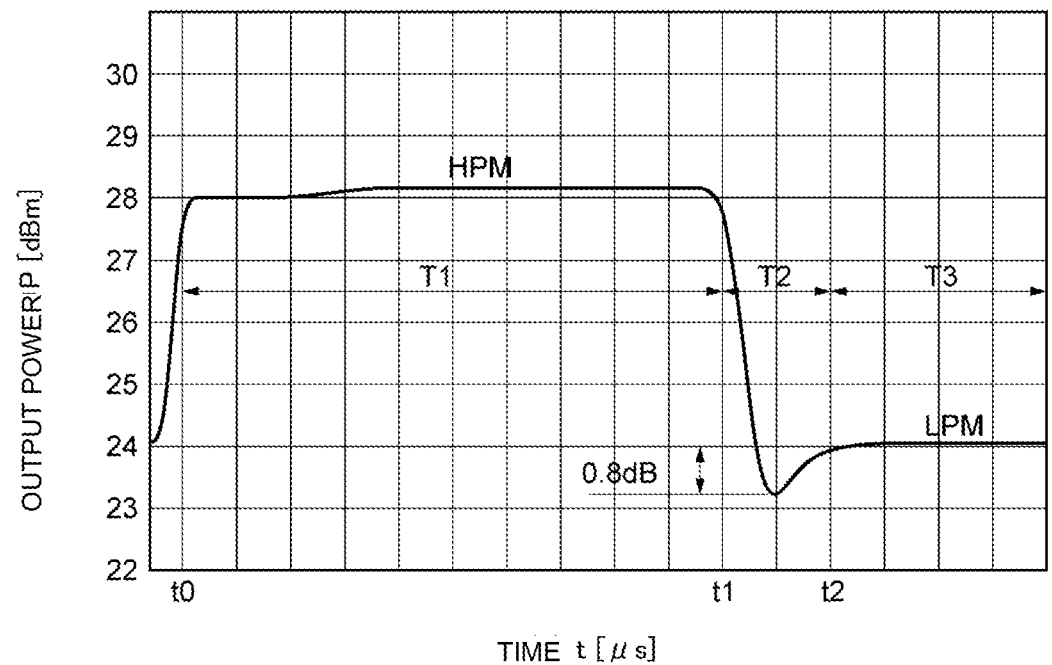
FIG. 3 is a graph for explaining operations of the power amplifier circuit according to the first embodiment.

FIG. 3 illustrates temporal changes in an output power P that is the power of the output signal RFout when the operation state of the power amplifier circuit 10 switches from the high power mode (HPM) to the low power mode (LPM).

In time range T1 from time t0 to time t1, the power amplifier circuit 10 operates in the high power mode. At time t1, the operation mode of the power amplifier circuit 10 switches to the low power mode. In time range T2 from time t1 to time t2, the operation state of the power amplifier circuit 10 is a transition state from the high power mode to the low power mode.

In time range T3 from time t2, the power amplifier circuit 10 operates in the low power mode.

In time range T1, the control circuit 106 outputs control signals for causing the bias circuit 1023 and the bias circuit 1033 to supply bias currents or voltages. The amplifier 102 and the amplifier 103 perform power amplification to thereby attain the high power mode.

In time range T2, the control circuit 106 outputs at time t1 a control signal for causing the bias circuit 1033 not to supply a bias current or voltage. At this time, the control circuit 106 continuously outputs a control signal for causing the bias circuit 1023 to supply a bias current or voltage.

When the bias circuit 1033 does not supply a bias current or voltage to the amplifier 103, the output power P decreases. At this time, the output power P does not instantaneously change due to a transient phenomenon of the amplifier 103 and the control circuit 106.

In time range T3, the output power P is stabilized at a predetermined power value in the low power mode.

In the power amplifier circuit 10, the amplifier 102 continuously operates upon switching of the operation state. Accordingly, the variation in the output power P in time range T2, that is, the variation in the gain of the power amplifier circuit 10, can be suppressed.

Figure 7:
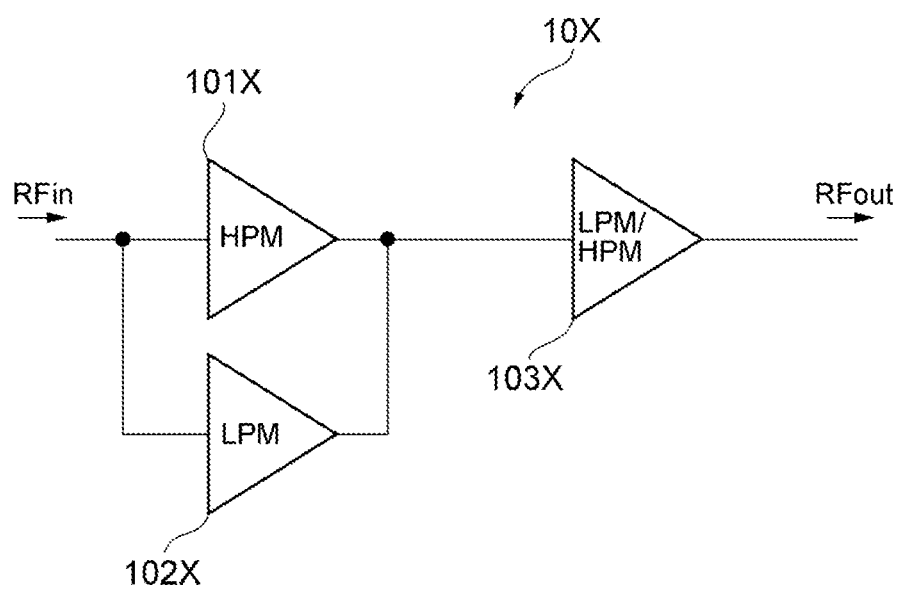
FIG. 7 is a block diagram of an example power amplifier circuit according to a comparative example.

For example, FIG. 7 is a block diagram of a power amplifier circuit 10X that is an example reference. The power amplifier circuit 10X switches between the high power mode and the low power mode by switching the on-off state of an amplifier 101X and that of an amplifier 102X.

Figure 8:
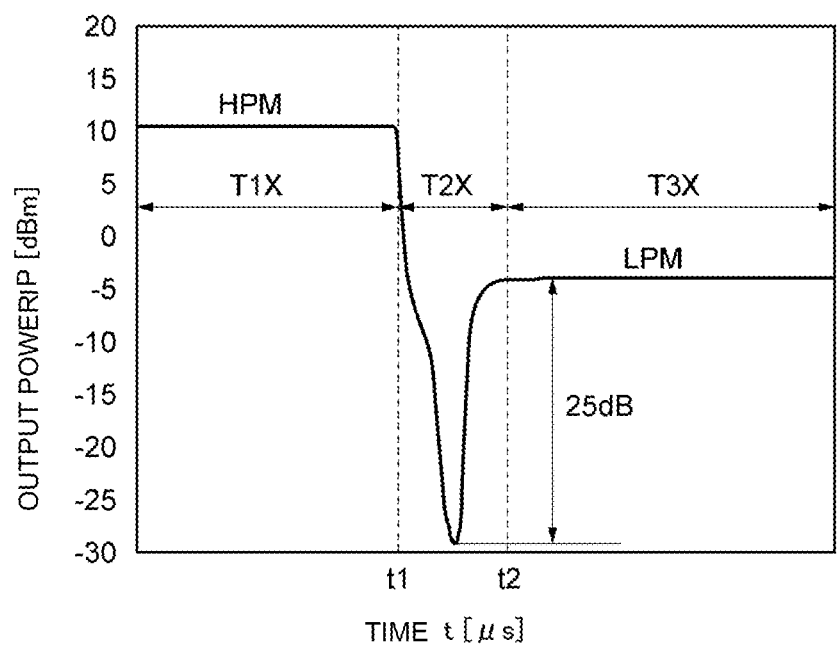
FIG. 8 is a graph for explaining operations of the power amplifier circuit according to the comparative example.

FIG. 8 illustrates temporal variations in the output power when the operation state of the power amplifier circuit 10X switches from the high power mode to the low power mode.

As illustrated in FIG. 8, the output power P deviates from the power in the low power mode by up to about 25 dB in time range T2X. This is because when the amplifier 101X is to be turned off and the amplifier 102X is to be turned on, both the amplifier 101X and the amplifier 102X are turned off and power amplification is not performed temporarily.

Figure 9:
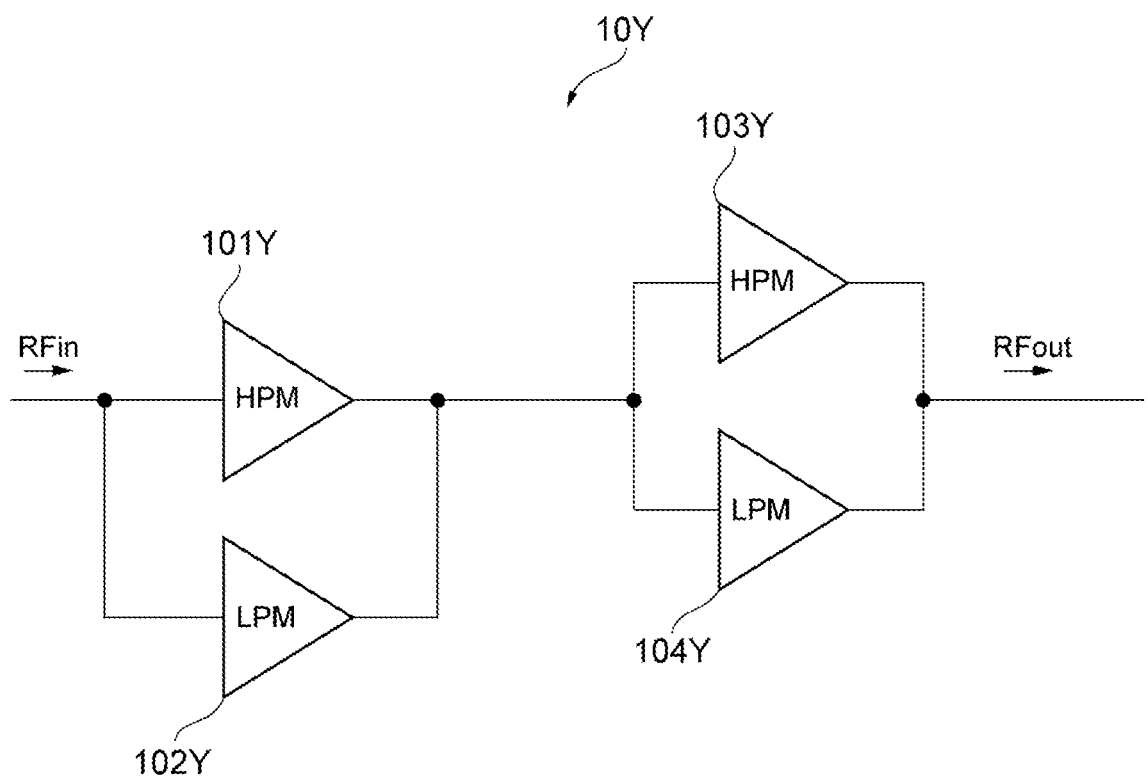
FIG. 9 is a block diagram of an example power amplifier circuit according to another comparative example.

FIG. 9 is a block diagram of a power amplifier circuit 10Y that is another example reference. In the power amplifier circuit 10Y, power amplification is performed by an amplifier 101Y and an amplifier 103Y in the high power mode, and power amplification is performed by an amplifier 102Y and an amplifier 104Y in the low power mode.

Figure 10:
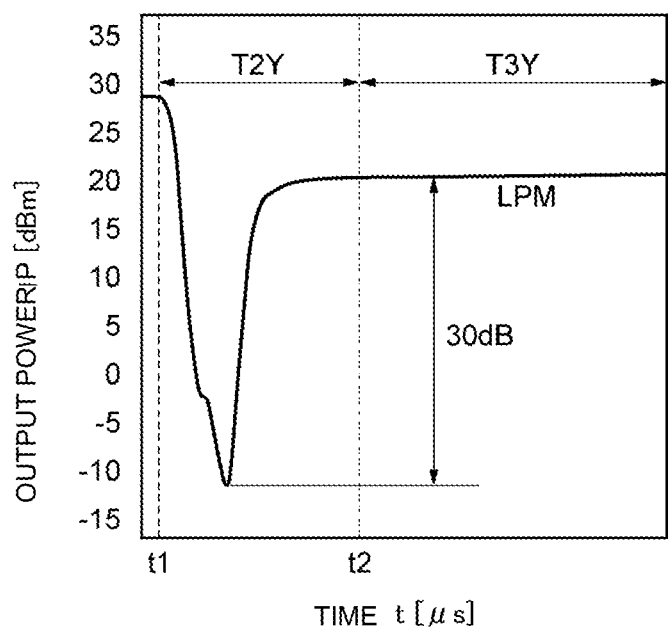
FIG. 10 is a graph for explaining operations of the power amplifier circuit according to another comparative example.

FIG. 10 illustrates temporal variations in the output power when the operation state of the power amplifier circuit 10Y switches from the high power mode to the low power mode. As illustrated in FIG. 10, the output power P also deviates from the power in the low power mode by up to about 30 dB, as in FIG. 8. This is because when the amplifier 101Y and the amplifier 103Y are to be turned off and the amplifier 102Y and the amplifier 104Y are to be turned on, both the amplifier 101Y and the amplifier 103Y are turned off and power amplification is not performed temporarily.

When the amounts of variation in the output power P in these example references are compared with the amount of variation in the output power P of the power amplifier circuit 10 illustrated in FIG. 3, it is found that the variation is suppressed to a large degree in the power amplifier circuit 10. The amount of variation in the power amplifier circuit 10 is about 0.8 dB.

Therefore, the power amplifier circuit 10 is a power amplifier circuit that is capable of suppressing a gain decrease upon switching of the operation state of the power amplifier circuit.

A description of a second embodiment will be given. In the second and subsequent embodiments, descriptions of matters common to the first embodiment will be omitted, and only descriptions of differences will be given. Specifically, similar operations or effects attained by similar configurations will not be mentioned one by one in each embodiment.

Figure 4:
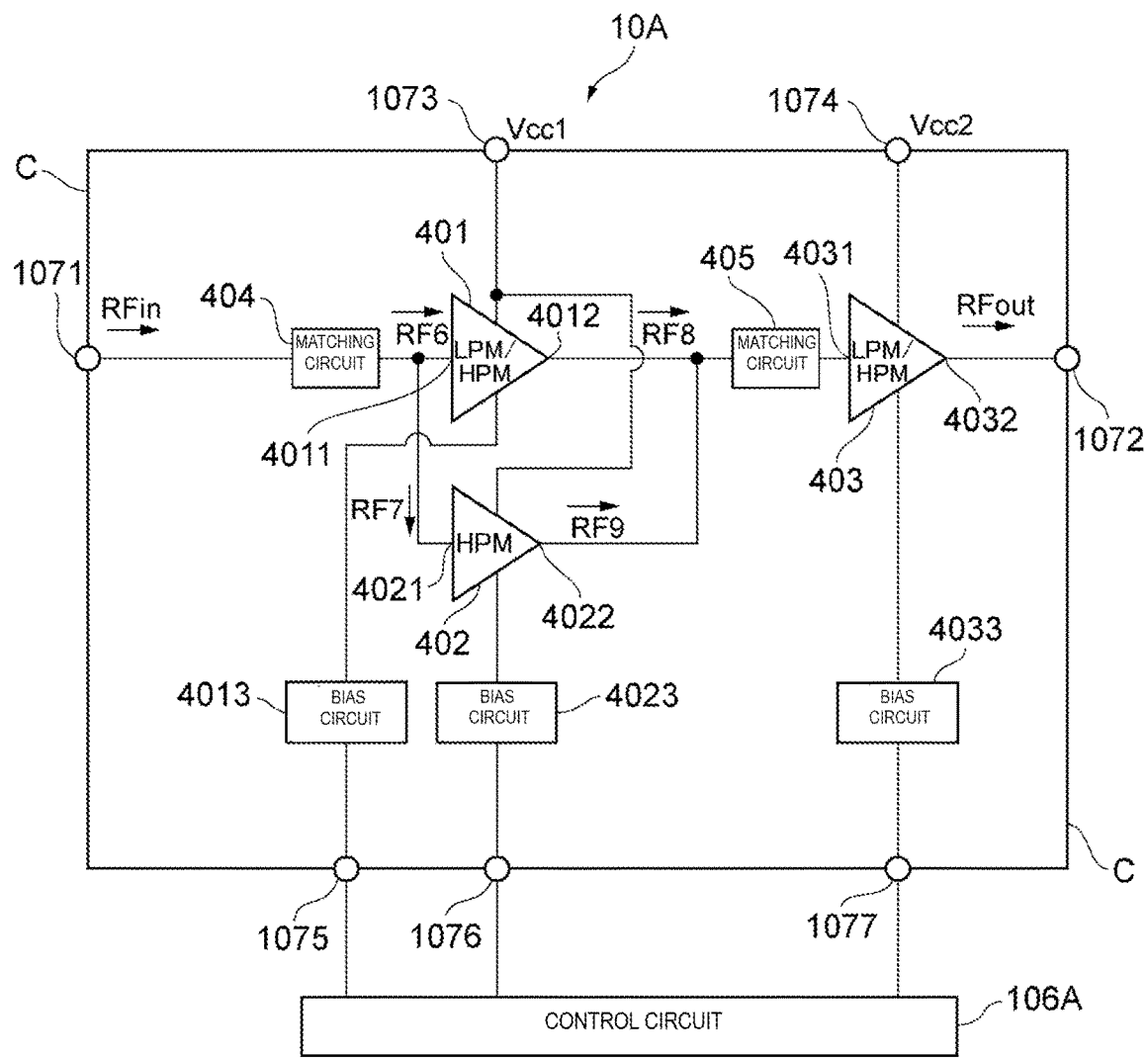
FIG. 4 is a block diagram of a power amplifier circuit according to a second embodiment.

FIG. 4 is a block diagram of a power amplifier circuit 10A according to the second embodiment. The power amplifier circuit 10A includes amplifiers 401, 402, and 403, matching circuits 404 and 405, and a control circuit 106A.

The power amplifier circuit 10A switches the operations of the amplifiers 401 and 402 closer to the terminal 1071, that is, in the first stage, to thereby switch the operation of the power amplifier circuit 10A between the high power mode and the low power mode. This is a difference from the power amplifier circuit 10 in which the operation state is switched by switching the operations of the amplifiers 102 and 103 closer to the terminal 1072, that is, in the last stage.

The amplifier (first amplifier) 401 has an input port 4011 and an output port (first output port) 4012. The amplifier 401 is connected to the terminal 1071 with the matching circuit 404 interposed therebetween. The amplifier 401 amplifies a signal (first signal) RF6 inputted via the input port 4011 and outputs a signal (fourth signal) RF8 from the output port 4012.

The amplifier (second amplifier) 402 has an input port 4021 and an output port (second output port) 4022. The amplifier 402 is connected to the terminal 1071 with the matching circuit 404 interposed therebetween. The amplifier 402 amplifies a signal (second signal) RF7 inputted via the terminal 4021 and outputs a signal (fifth signal) RF9 from the output port 4022.

The amplifier (fourth amplifier) 403 has an input port 4031 and an output port 4032. The input port 4031 is connected to the output port 4012 and the output port 4022.

The amplifier 403 outputs the output signal (sixth signal) RFout on the basis of the signal RF8 and the signal RF9.

A bias circuit (first bias circuit) 4013 supplies a bias current or voltage (first bias current or voltage) to the amplifier 401 in accordance with a signal supplied via the terminal 1075. A bias circuit (second bias circuit) 4023 supplies a bias current or voltage (second bias current or voltage) to the amplifier 402 in accordance with a signal supplied via the terminal 1076. A bias circuit 4033 provides a bias current or voltage to the amplifier 403 in accordance with a signal supplied via the terminal 1077.

The control circuit 106A is connected to the bias circuits 4013, 4023, and 4033 with the terminals 1075, 1076, and 1077 interposed therebetween, respectively.

When the power amplifier circuit operates in the low power mode, the control circuit 106A outputs control signals to the bias circuit 4013 and the bias circuit 4023 such that a bias current or voltage is supplied to the amplifier 401 and a bias current or voltage is not supplied to the amplifier 402.

When the power amplifier circuit operates in the high power mode, the control circuit 106A outputs control signals to the bias circuit 4013 and the bias circuit 4023 such that bias currents or voltages are supplied to the amplifier 401 and the amplifier 402.

The control circuit 106A outputs to the bias circuit 4033 a control signal for causing the bias circuit 4033 to supply a bias current or voltage to the amplifier 403 regardless of whether the state of the power amplifier circuit 10A is the low power mode or the high power mode.

In the power amplifier circuit 10A, the amplifier 401 performs power amplification regardless of whether the operation state is the low power mode or the high power mode. The amplifier 402 performs power amplification only when the operation state is the high power mode. Accordingly, even when the operation state of the power amplifier circuit 10A switches from the high power mode to the low power mode, the amplifier 401 can be continuously operated.

The power amplifier circuit 10A also can suppress a gain decrease upon switching of the operation state of the power amplifier circuit.

Figure 5:
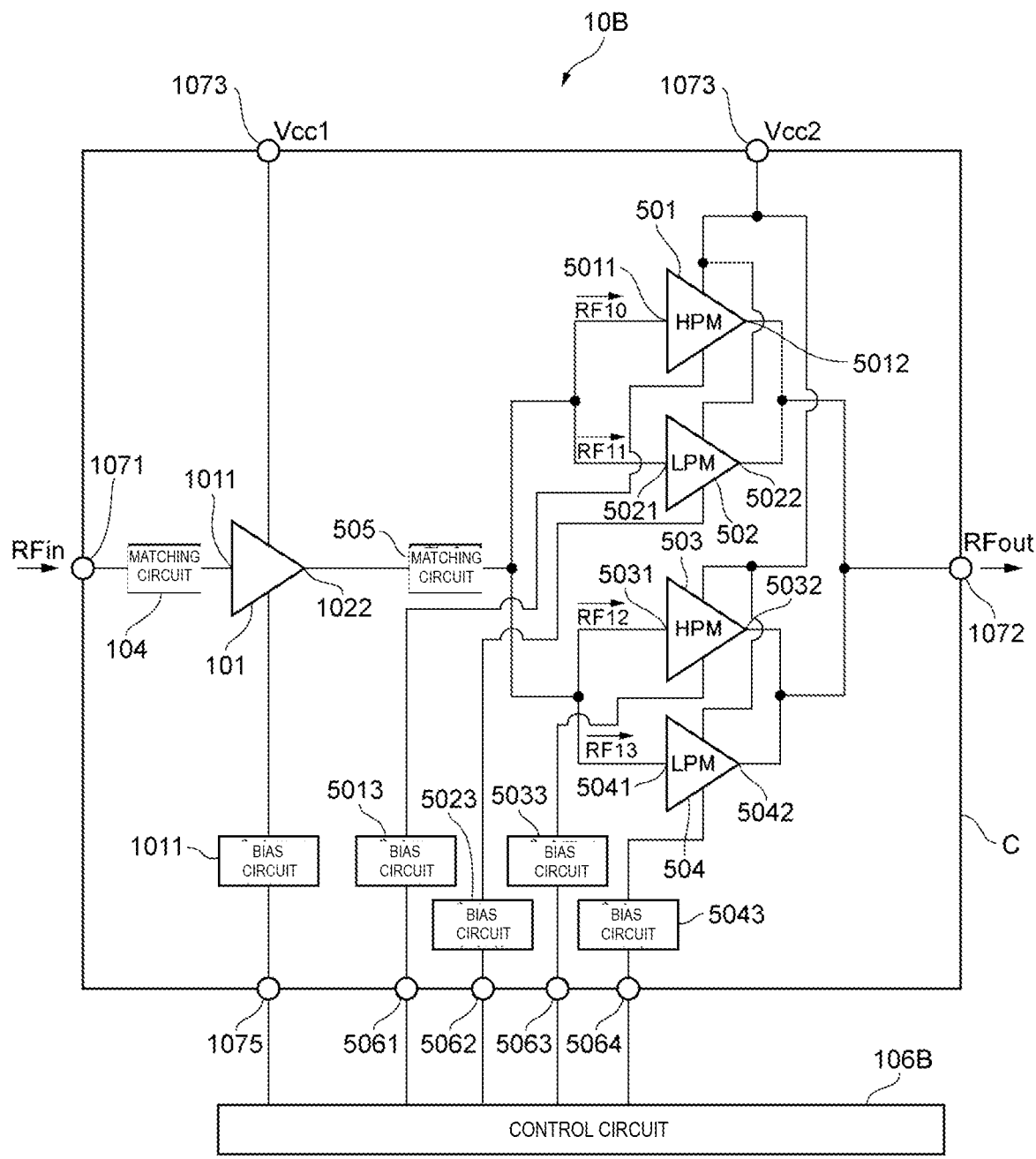
FIG. 5 is a block diagram of a power amplifier circuit according to a third embodiment.

A description of a third embodiment will be given. FIG. 5 is a block diagram of a power amplifier circuit 10B according to the third embodiment. The power amplifier circuit 10B is a circuit having a differential configuration in which two pairs each including the amplifier 102 and the amplifier 103 of the power amplifier circuit 10 according to the first embodiment are disposed.

In the power amplifier circuit 10B, the input signal RFin is amplified by the amplifier 101, and a signal RF10 (first signal), a signal RF11 (second signal), a signal RF12 (third signal), and a signal RF13 (fourth signal) are supplied to amplifiers 501, 502, 503, and 504 respectively via a matching circuit 505. The signals RF10 to RF13 are distributed and supplied by a distributor (not illustrated) disposed in the stage subsequent to the matching circuit 505 such that the phases of the signal RF10 and the signal RF11 are different from the phases of the signal RF12 and the signal RF13 by about 180 degrees.

The power amplifier circuit 10B includes the amplifiers 501, 502, 503, and 504 and bias circuits 5013, 5023, 5033, and 5043. The amplifiers 501, 502, 503, and 504 respectively have input ports 5011, 5021, 5031 (third input port), and 5041 (fourth input port) and output ports 5012, 5022, 5032, and 5042. A control circuit 106B is connected to the bias circuit 5013, 5023, 5033, and 5043 with terminals 5061, 5062, 5063, and 5064 interposed therebetween, respectively.

When the power amplifier circuit 10B operates in the low power mode, the control circuit 106B outputs control signals for causing the bias circuit 5013 and the bias circuit 5033 to supply a bias current or voltage. In this case, the control circuit 106B outputs control signals for causing the bias circuit 5023 and the bias circuit 5043 not to supply a bias current or voltage.

When the power amplifier circuit 10B operates in the high power mode, the control circuit 106B outputs control signals for causing the bias circuit 5013 and the bias circuit 5033 to supply a bias current or voltage. The control circuit 106B further outputs control signals for causing the bias circuit 5023 and the bias circuit 5043 to supply a bias current or voltage.

In the power amplifier circuit 10B, the amplifiers 501 and 503 perform power amplification regardless of whether the operation state is the low power mode or the high power mode. The amplifiers 502 and 504 perform power amplification only when the operation state is the high power mode. Accordingly, even when the operation state of the power amplifier circuit 10B switches from the high power mode to the low power mode, the amplifiers 501 and 503 can be continuously operated.

The power amplifier circuit 10B also can suppress a gain decrease upon switching of the operation state of the power amplifier circuit.

Figure 6:
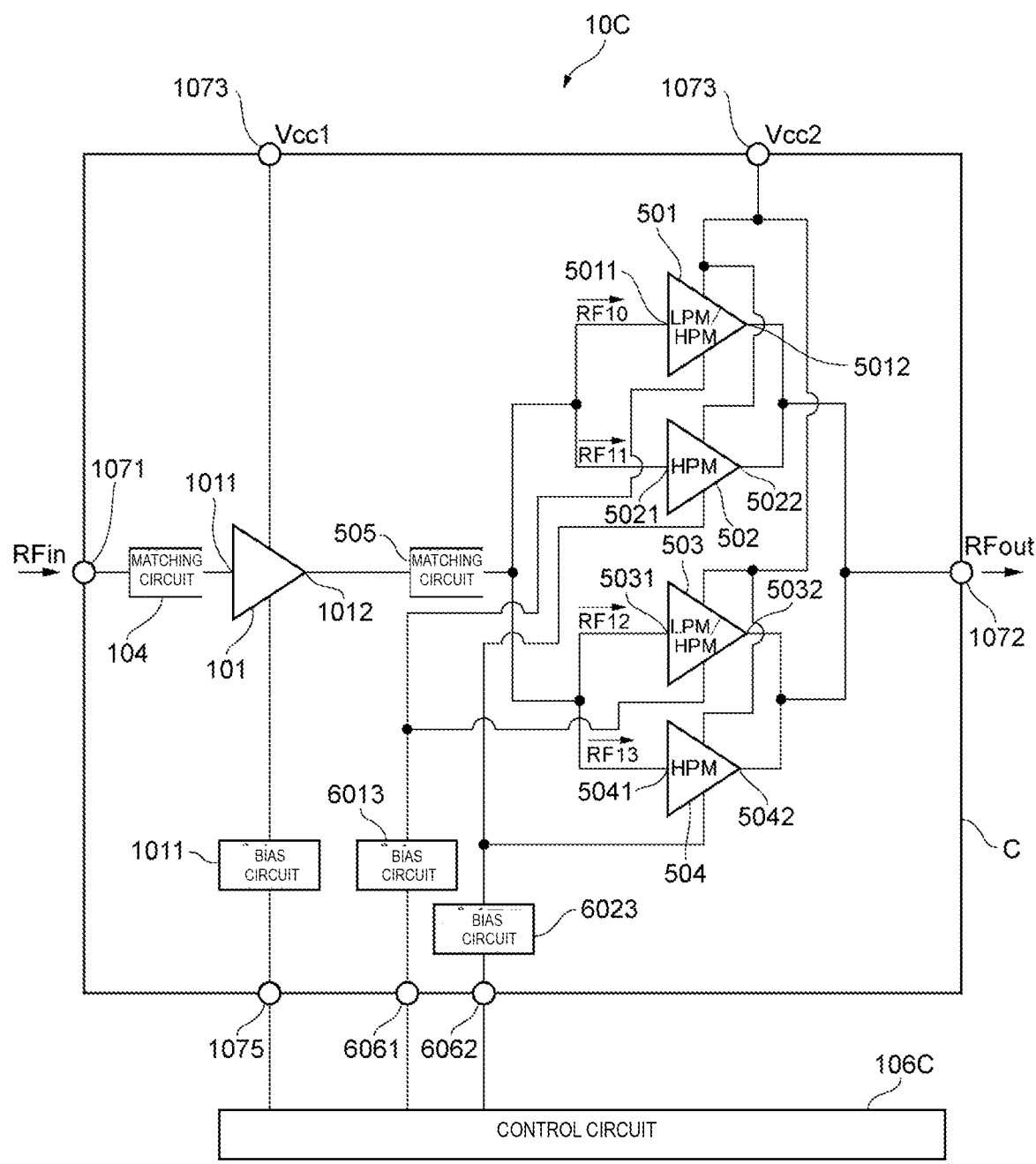
FIG. 6 is a block diagram of a power amplifier circuit according to a fourth embodiment.

A description of a fourth embodiment will be given. FIG. 6 is a block diagram of a power amplifier circuit 10C according to the fourth embodiment. The power amplifier circuit 10C is a circuit obtained by replacing the bias circuits 5013 and 5033 in the power amplifier circuit 10B according to the third embodiment with a bias circuit 6013 and replacing the bias circuits 5023 and 5043 therein with a bias circuit 6023.

The bias circuit 6013 is a circuit having a circuit configuration similar to that of the bias circuit 1023 illustrated in FIG. 2. In the bias circuit 6013, the emitter of a transistor corresponding to the transistor 2051 in the bias circuit 1023 illustrated in FIG. 2 is connected to the amplifiers 501 and 503.

The bias circuit 6023 is a circuit having a circuit configuration similar to that of the bias circuit 1033 illustrated in FIG. 2. In the bias circuit 6023, the emitter of a transistor corresponding to the transistor 2061 in the bias circuit 1033 illustrated in FIG. 2 is connected to the amplifiers 502 and 504.

A control circuit 106C is connected to the bias circuits 6013 and 6023 with terminals 6061 and 6062 interposed therebetween, respectively.

When the power amplifier circuit 10C operates in the low power mode, the control circuit 106C outputs a control signal for causing the bias circuit 6013 to supply a bias current or voltage. In this case, the control circuit 106C outputs a control signal for causing the bias circuit 6023 not to supply a bias current or voltage.

When the power amplifier circuit 10C operates in the high power mode, the control circuit 106C outputs a control signal for causing the bias circuit 6013 to supply a bias current or voltage. In this case, the control circuit 106C outputs a control signal for causing the bias circuit 6023 to supply a bias current or voltage.

In the power amplifier circuit 10C, the amplifiers 501 and 503 perform power amplification regardless of whether the operation state is the low power mode or the high power mode. The amplifiers 502 and 504 perform power amplification only when the operation state is the high power mode. Accordingly, even when the operation state of the power amplifier circuit 10C switches from the high power mode to the low power mode, the amplifiers 501 and 503 can be continuously operated.

The power amplifier circuit 10C also can suppress a gain decrease upon switching of the operation state of the power amplifier circuit.

When the power amplifier circuit 10C operates in the low power mode, the control circuit 106C may output a control signal for causing the bias circuit 6013 to supply a bias current or voltage having a current value or a voltage value smaller than the current value or the voltage value of a bias current or voltage in the high power mode.

When the bias current value or voltage value supplied to the amplifiers 501 and 503 is adjusted, the current values of signals outputted from the amplifiers 501 and 503 in the low power mode can be made smaller than those in the high power mode. Accordingly, the power-added efficiencies of the amplifiers 501 and 503 can be increased.

In this case, for example, the bias circuit 6013 may supply to the amplifiers 501 and 503 a bias current or voltage having a current value or a voltage value that is within a range of 20% to 80% of the current value or the voltage value of a bias current or voltage in the high power mode.

When the power amplifier circuit 10C operates in the low power mode, the control circuit 106C may output a control signal for causing the bias circuit 6023 to supply a bias current or voltage having a current value or a voltage value smaller than the current value or the voltage value of a bias current or voltage in the high power mode.

The amplifiers 502 and 504 perform an amplification operation only in the high power mode. When the amplifiers 502 and 504 enter a complete off state in which no bias current or voltage is supplied, the impedances of the amplifiers 501, 502, 503, and 504 seen from the output side of the matching circuit 505 change to a large degree. Specifically, the power amplifier circuit 10C is configured to perform differential amplification, and therefore, the impedances change to a larger degree than in a non-differential configuration. Due to the changes in the impedances, the voltage standing wave ratio (VSWR) in an input to each of the amplifiers 501, 502, 503, and 504 may be worsened.

When the power amplifier circuit 10C operates in the low power mode, the control circuit 106C performs control such that the bias circuit 6023 supplies a predetermined bias current or voltage having a current value or a voltage value with which the amplifier 502 or 504 does not perform an amplification operation. Accordingly, the amplifier 502 or 504 does not enter a complete off state, and changes in the impedances can be suppressed. When changes in the impedances are suppressed, worsening of the VSWR can be suppressed.

In this case, for example, the bias circuit 6023 may supply to the amplifiers 502 and 504 a bias current or voltage having a current value or a voltage value that is within a range of 20% to 80% of the current value or the voltage value of a bias current or voltage in the high power mode.

The transistor in the bias circuit 6013 connected to the amplifiers 501 and 503 may have an emitter size the same as the emitter size of the transistor in the bias circuit 6023 connected to the amplifiers 502 and 504. In this case, in accordance with the value of a control signal supplied to the bias circuit 6013 by the control circuit 106C, a current or a voltage to be supplied to the base of the transistor connected to the amplifiers 501 and 503 is adjusted. When the current or the voltage to be supplied to the base of the transistor is adjusted, a bias current or voltage to be supplied to the amplifiers 501 and 503 by the bias circuit 6013 is adjusted. The same applies to the bias circuit 6023.

Exemplary embodiments of the present disclosure have been described above. The power amplifier circuit 10 includes the amplifier 102 that has the input port 1021 and amplifies the signal RF2 inputted via the input port 1021, the amplifier 103 that has the input port 1031 connected in parallel with the input port 1021 of the amplifier 102 and amplifies the signal RF3 inputted via the input port 1031, the bias circuit 1023 that supplies a bias current or voltage to the amplifier 102, the bias circuit 1033 that supplies a bias current or voltage to the amplifier 103, and the control circuit 106 that controls the bias circuit 1023 and the bias circuit 1033.

When the power amplifier circuit 10 operates in the low power mode, the control circuit 106 controls the bias circuit 1023 and the bias circuit 1033 such that the bias current or voltage is supplied to the amplifier 102 and the bias current or voltage is not supplied to the amplifier 103. When the power amplifier circuit 10 operates in the high power mode in which the output power is higher than the output power in the low power mode, the control circuit 106 controls the bias circuit 1023 and the bias circuit 1033 such that the bias current or voltage is supplied to the amplifier 102 and the bias current or voltage is supplied to the amplifier 103.

Accordingly, even when the operation state of the power amplifier circuit 10 switches from the high power mode to the low power mode, the amplifier 102 can be continuously operated. Therefore, a gain decrease upon switching of the operation state of the power amplifier circuit can be suppressed.

In the power amplifier circuit 10, the bias circuits 1023 and 1033 are respectively connected to the amplifiers 102 and 103. Therefore, in the low power mode in which the amplifier 103 is turned off, a signal from the bias circuit 1023 does not come to the amplifier 103. Accordingly, operations of the power amplifier circuit 10 can be stabilized.

Further, the control circuit 106 switches the bias current or voltage supply states of the amplifier 102 and the amplifier 103, and therefore, for example, the bias circuit 1023 or the bias circuit 1033 need not include a switch formed of, for example, an FET. Accordingly, members that form the power amplifier circuit 10 can be members suitable for allowing the amplifiers 101, 102, and 103 to be formed of bipolar transistors.

The power amplifier circuit 10 further includes the amplifier 101 that has the output port 1012 connected to the input port 1021 and the input port 1031 and outputs the signal RF2 and the signal RF3 via the output port 1012 on the basis of the input signal RFin. Accordingly, the amplifier operations of the amplifiers 102 and 103 in the last stage of the power amplifier circuit 10 can be switched.

In the power amplifier circuit 10A according to the second embodiment, the amplifier 401 has the output port 4012 and outputs via the output port 4012 the signal RF8 obtained by amplifying the signal RF6. The amplifier 402 has the output port 4022 and outputs via the output port 4022 the signal RF9 obtained by amplifying the signal RF7. The power amplifier circuit 10A further includes the amplifier 403 that has the input port 4031 connected to the output port 4012 and the output port 4022 and outputs the output signal RFout on the basis of the signal RF8 and the signal RF9 inputted via the input port 4031.

Accordingly, amplification in the first stage of the power amplifier circuit 10A can be performed while suppressing a gain decrease upon switching of the operation state of the power amplifier circuit 10A.

The power amplifier circuit 10C includes the amplifier 501 that has the input port 5011 and amplifies the signal RF10 inputted via the input port 5011, the amplifier 502 that has the input port 5021 connected in parallel with the input port 5011 of the amplifier 501 and amplifies the signal RF11 inputted via the input port 5021, the amplifier 503 that has the input port 5031 and amplifies the signal RF12 inputted via the input port 5031, and the amplifier 504 that has the input port 5041 connected in parallel with the input port 5031 of the amplifier 503 and amplifies the signal RF13 inputted via the input port 5041.

The power amplifier circuit 10C includes the bias circuit 6013 that supplies a bias current or voltage to the amplifier 501 and the amplifier 503, the bias circuit 6023 that supplies a bias current or voltage to the amplifier 502 and the amplifier 504, and the control circuit 106C that controls the bias circuit 6013 and the bias circuit 6023.

In the power amplifier circuit 10C, when the power amplifier circuit operates in the low power mode, the control circuit 106C controls the bias circuit 6013 and the bias circuit 6023 such that the first bias current or voltage is supplied to the amplifier 501 and the amplifier 503 and the second bias current or voltage is not supplied to the amplifier 502 or the amplifier 504. When the power amplifier circuit operates in the high power mode in which the output power is higher than the output power in the low power mode, the control circuit 106C controls the bias circuit 6013 and the bias circuit 6023 such that the first bias current or voltage is supplied to the amplifier 501 and the amplifier 503 and the second bias current or voltage is supplied to the amplifier 502 and the amplifier 504.

In the power amplifier circuit 10C, the amplifiers 501 and 503 also can be continuously operated even when the operation state of the power amplifier circuit 10C switches from the high power mode to the low power mode. Therefore, a gain decrease upon switching of the operation state of the power amplifier circuit can be suppressed.

When the power amplifier circuit 10C operates in the low power mode, the bias circuit 6013 may supply to the amplifier 501 and the amplifier 503 a bias current or voltage having a current value or a voltage value that is smaller than the current value or the voltage value of a bias current or voltage in the high power mode and that is not equal to zero. The current value or the voltage value of the first bias current or voltage in the low power mode may be a value that is within a range of 20% to 80% of the current value or the voltage value of the first bias current or voltage in the high power mode.

Accordingly, the current values of signals outputted from the amplifiers 501 and 503 can be made smaller than those in the high power mode. Therefore, the power-added efficiencies of the amplifiers 501 and 503 can be increased.

When the power amplifier circuit 10C operates in the low power mode, the bias circuit 6023 may supply to the amplifier 502 and the amplifier 504 a bias current or voltage having a current value or a voltage value that is smaller than the current value or the voltage value of a bias current or voltage in the high power mode and that is not equal to zero. The current value or the voltage value of the second bias current or voltage in the low power mode may be a value that is within a range of 20% to 80% of the current value or the voltage value of the second bias current or voltage in the high power mode.

Accordingly, the amplifier 502 or 504 does not enter a complete off state. Therefore, changes in the impedances of the amplifiers 501, 502, 503, and 504 seen from the output side of the matching circuit 505 can be suppressed. When changes in the are suppressed, worsening of the VSWR can be suppressed.

In the power amplifier circuit 10C, the bias circuit 6013 may include a first transistor that has an emitter connected to the amplifier 501 and the amplifier 503 and supplies a bias current or voltage via the emitter, and the bias circuit 6023 may include a second transistor that has an emitter connected to the amplifier 502 and the amplifier 504 and supplies a bias current or voltage via the emitter, and the emitter of the second transistor has an emitter size equal to the emitter size of the emitter of the first transistor.

The control circuit 106C may control a base current or voltage to be supplied to the base of the first transistor to thereby control the current value or the voltage value of the first bias current or voltage, and may control a base current or voltage to be supplied to the base of the second transistor to thereby control the current value or the voltage value of the second bias current or voltage. Accordingly, bias currents or voltages to be supplied to the amplifiers 501, 502, 503, and 504 can be adjusted.

Note that the embodiments described above are intended to facilitate understanding of the present disclosure and are not intended to construe the present disclosure in a limited manner. The present disclosure can be changed/modified without departing from the spirit thereof, and the present disclosure includes equivalents thereof. That is, configurations obtained by a person skilled in the art adding design changes to the embodiments as appropriate are included in the scope of the present disclosure as long as the configurations have the characteristics of the present disclosure. For example, elements, and the arrangements, conditions, materials, shapes, sizes, and so on of the elements described in the embodiments are not limited to those described above and can be changed as appropriate. Further, the embodiments are examples, and configurations described in different embodiments can be partially replaced or can be combined as a matter of course, and configurations thus obtained are also included in the scope of the present disclosure as long as the configurations have the characteristics of the present disclosure.

What is claimed is:

1. A power amplifier circuit comprising:
   a first amplifier that has a first input port and that is configured to amplify a first signal input via the first input port;
   a second amplifier that has a second input port connected in parallel with the first input port of the first amplifier and that is configured to amplify a second signal input via the second input port;
   a first bias circuit configured to supply a first bias current or a first bias voltage to the first amplifier;
   a second bias circuit configured to supply a second bias current or a second bias voltage to the second amplifier; and
   a control circuit configured to control the first bias circuit and the second bias circuit, wherein:
   when the power amplifier circuit operates in a first power mode, the control circuit is configured to control the first bias circuit and the second bias circuit such that the first bias current or the first bias voltage is supplied to the first amplifier, and the second bias current or the second bias voltage is not supplied to the second amplifier,
   when the power amplifier circuit operates in a second power mode, the control circuit is configured to control the first bias circuit and the second bias circuit such that the first bias current or the first bias voltage is supplied to the first amplifier and the second bias current or the second bias voltage is supplied to the second amplifier,
   an output power of the power amplifier circuit is higher in the second power mode than in the first power mode, and
   the control circuit is further configured to continuously operate the first amplifier when the power mode is switched from the first power mode to the second power mode.

2. The power amplifier circuit according to claim 1, further comprising:
   a third amplifier that has an output port connected to the first input port and to the second input port, and that is configured to output the first signal and the second signal via the output port based on a third signal.

3. The power amplifier circuit according to claim 1, wherein:
   the first amplifier has a first output port and is configured to output, via the first output port, a fourth signal obtained by amplifying the first signal,
   the second amplifier has a second output port and is configured to output, via the second output port, a fifth signal obtained by amplifying the second signal, and
   the power amplifier circuit further comprises a fourth amplifier that has an input port connected to the first output port and to the second output port, and that is configured to output a sixth signal based on the fourth signal and the fifth signal input via the input port.

4. The power amplifier circuit according to claim 1, wherein the control circuit is further configured to control the first bias circuit such that the first bias current or the first bias voltage is continuously supplied to the first amplifier during a power mode change.

5. A power amplifier circuit comprising:
   a first amplifier that has a first input port and that is configured to amplify a first signal input via the first input port;
   a second amplifier that has a second input port connected in parallel with the first input port of the first amplifier, and that is configured to amplify a second signal input via the second input port;
   a third amplifier that has a third input port and that is configured to amplify a third signal input via the third input port;
   a fourth amplifier that has a fourth input port connected in parallel with the third input port of the third amplifier, and that is configured to amplify a fourth signal input via the fourth input port;
   a first bias circuit that is configured to supply a first bias current or a first bias voltage to the first amplifier and to the third amplifier;
   a second bias circuit that is configured to supply a second bias current or a second bias voltage to the second amplifier and to the fourth amplifier; and
   a control circuit that is configured to control the first bias circuit and the second bias circuit, wherein:
   when the power amplifier circuit operates in a first power mode, the control circuit is configured to control the first bias circuit and the second bias circuit such that the first bias current or the first bias voltage is supplied to the first amplifier and to the third amplifier, and the second bias current or the second bias voltage is not supplied to the second amplifier or to the fourth amplifier, when the power amplifier circuit operates in a second power mode, the control circuit is configured to control the first bias circuit and the second bias circuit such that the first bias current or the first bias voltage is supplied to the first amplifier and to the third amplifier, and the second bias current or the second bias voltage is supplied to the second amplifier and to the fourth amplifier, an output power of the power amplifier circuit is higher in the second power mode than in the first power mode, and the control circuit is further configured to continuously operate the first amplifier when the power mode is switched from the first power mode to the second power mode.

6. The power amplifier circuit according to claim 5, wherein when the power amplifier circuit operates in the first power mode, a current value of the first bias current or a voltage value of the first bias voltage is not equal to zero and is smaller than when the power amplifier circuit operates in the second power mode.

7. The power amplifier circuit according to claim 6, wherein the current value or the voltage value of the first bias current or voltage in the first power mode is between 20% and 80% of the current value or the voltage value of the first bias current or the first bias voltage in the second power mode.

8. The power amplifier circuit according to claim 5, wherein when the power amplifier circuit operates in the first power mode, a current value of the second bias current or a voltage value of the second bias voltage is not equal to zero and is smaller than when the power amplifier circuit operates in the second power mode.

9. The power amplifier circuit according to claim 8, wherein the current value or the voltage value of the second bias current or the second bias voltage in the first power mode is between 20% and 80% of the current value or the voltage value of the second bias current or the second bias voltage in the second power mode.

10. The power amplifier circuit according to claim 5, wherein:

the first bias circuit comprises a first transistor that has an emitter connected to the first amplifier and to the third amplifier, and that is configured to supply the first bias current or the first bias voltage via the emitter, the second bias circuit comprises a second transistor that has an emitter connected to the second amplifier and to the fourth amplifier, and that is configured to supply the second bias current or the second bias voltage via the emitter, an emitter size of the emitter of the second transistor is equal to an emitter size of the emitter of the first transistor, and the control circuit is configured to:
control a base current or a base voltage supplied to a base of the first transistor, thereby controlling a current value of the first bias current or a voltage value of the first bias voltage, and
control a base current or voltage supplied to a base of the second transistor, thereby controlling a current value of the second bias current or a voltage value of the second bias voltage.

11. The power amplifier circuit according to claim 5, wherein the control circuit is further configured to control the first bias circuit such that the first bias current or the first bias voltage is continuously supplied to the first amplifier during a power mode change.

* * * * *

UNITED STATES PATENT AND TRADEMARK OFFICE
CERTIFICATE OF CORRECTION

| | | |
|---|---|---|
| PATENT NO. | : 12,294,339 B2 | Page 1 of 1 |
| APPLICATION NO. | : 17/650408 | |
| DATED | : May 6, 2025 | |
| INVENTOR(S) | : Kenichi Shimamoto | |

It is certified that error appears in the above-identified patent and that said Letters Patent is hereby corrected as shown below:

In the Specification

Column 13, Line 5, "changes in the are suppressed," should be --changes in the impedances are suppressed,--

Signed and Sealed this
Fifteenth Day of July, 2025

Coke Morgan Stewart
*Acting Director of the United States Patent and Trademark Office*